United States Patent
Park

(10) Patent No.: US 7,110,275 B2
(45) Date of Patent: Sep. 19, 2006

(54) HIGH SPEED NAND-TYPE CONTENT ADDRESSABLE MEMORY (CAM)

(75) Inventor: Kee Park, San Jose, CA (US)

(73) Assignee: Integrated Device Technology Inc., San Jose, CA (US)

(*) Notice: Subject to any disclaimer, the term of this patent is extended or adjusted under 35 U.S.C. 154(b) by 0 days.

(21) Appl. No.: 11/137,163

(22) Filed: May 25, 2005

(65) Prior Publication Data

US 2005/0213360 A1 Sep. 29, 2005

Related U.S. Application Data

(63) Continuation-in-part of application No. 10/609,756, filed on Jun. 30, 2003, now Pat. No. 6,900,999.

(51) Int. Cl.
*G11C 15/00* (2006.01)

(52) U.S. Cl. .................. 365/49; 365/63; 365/168

(58) Field of Classification Search .............. 365/49, 365/63, 168
See application file for complete search history.

(56) References Cited

U.S. PATENT DOCUMENTS

| | | | |
|---|---|---|---|
| 5,699,288 A | 12/1997 | Kim et al. | |
| 5,859,791 A | 1/1999 | Schultz et al. | |
| 6,044,005 A | 3/2000 | Gibson et al. | |
| 6,078,987 A * | 6/2000 | Kongetira | 711/108 |
| 6,166,938 A * | 12/2000 | Wong | 365/49 |
| 6,188,594 B1 | 2/2001 | Ong | 365/49 |
| 6,195,278 B1 | 2/2001 | Calin et al. | |
| 6,240,004 B1 | 5/2001 | Kuo et al. | |
| 6,256,216 B1 | 7/2001 | Lien et al. | |
| 6,262,907 B1 | 7/2001 | Lien et al. | 365/49 |
| 6,349,049 B1 | 2/2002 | Schoy | |
| 6,362,993 B1 | 3/2002 | Henderson et al. | 365/49 |
| 6,370,052 B1 | 4/2002 | Hsu et al. | 365/49 |
| 6,374,325 B1 | 4/2002 | Simpson et al. | 711/108 |
| 6,385,070 B1 * | 5/2002 | Peterson | 365/49 |
| 6,430,073 B1 | 8/2002 | Batson et al. | 365/49 |
| 6,480,406 B1 | 11/2002 | Jin et al. | 365/49 |
| 6,496,398 B1 * | 12/2002 | Hellner et al. | 365/49 |
| 6,515,884 B1 | 2/2003 | Sywyk et al. | 365/49 |
| 6,522,562 B1 | 2/2003 | Foss | 365/49 |
| 6,563,727 B1 | 5/2003 | Roth et al. | 365/49 |
| 6,618,280 B1 | 9/2003 | Takahashi et al. | |

(Continued)

OTHER PUBLICATIONS

Annex to Form PCT/ISA/206, Communication Relating to the Results of the Partial International Search, PCT/US2004/019148, Nov. 24, 2004.

*Primary Examiner*—Tuan T. Nguyen
(74) *Attorney, Agent, or Firm*—Myers Bigel Sibley & Sajovec PA

(57) ABSTRACT

A CAM block includes a CAM array having a plurality of rows and columns of 4-bit NAND-type CAM cells therein. Each of a plurality of the NAND-type cells includes a respective ladder-type compare circuit having four two-transistor rungs. At least one of the plurality of rows includes a first 4-bit NAND-type CAM cell having a first ladder-type compare circuit with four two-transistor rungs and a second 4-bit NAND-type CAM cell having a second ladder-type compare circuit with four two-transistor rungs. A match line segment is also provided, which is connected to four source terminals of transistors in the first ladder-type compare circuit and four drain terminals of transistors in the second ladder-type compare circuit.

6 Claims, 10 Drawing Sheets

U.S. PATENT DOCUMENTS

| | | |
|---|---|---|
| 6,678,184 B1 | 1/2004 | Lysinger et al. ............... 365/49 |
| 6,760,249 B1 | 7/2004 | Chien |
| 6,947,302 B1 * | 9/2005 | Regev ......................... 365/49 |
| 2002/0036912 A1 * | 3/2002 | Helwig ......................... 365/49 |
| 2002/0141218 A1 | 10/2002 | Foss et al. .................... 365/49 |
| 2003/0035331 A1 | 2/2003 | Foss et al. ................... 365/200 |

\* cited by examiner

HIGH SPEED NAND-TYPE CONTENT ADDRESSABLE MEMORY (CAM)

REFERENCE TO PRIORITY APPLICATION

This application is a continuation-in-part of U.S. application Ser. No. 10/609,756, filed Jun. 30, 2003, now U.S. Pat. No. 6,900,999, issued May 31, 2005, the disclosure of which is hereby incorporated herein by reference.

FIELD OF THE INVENTION

The present invention relates to integrated circuit memory devices and, more particularly, to content addressable memory (CAM) devices.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry.

The cells within a CAM array are frequently configured as binary CAM cells that store only data bits (as "1" or "0" logic values) or as ternary (or quaternary) CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, ..., {1XXX}, {XXXX}. A quaterna CAM cell is different from a ternary CAM cell because it has four valid combinations of states: ((data=0, mask=active), (data=1, mask=active), (data=0, mask=inactive), (data=1, mask=inactive)). Quaternary CAM cells are frequently treated as "ternary" CAM cells because two of the four states represent equivalent active mask conditions when search operations are performed. However, ternary CAM (TCAM) cells and quaternary CAM (QCAM) cells will be treated herein as separate categories of CAM cells.

CAM cells may use a variety of different memory cell technologies, including volatile SRAM and DRAM technologies and nonvolatile memory technologies. CAM cells based on these technologies are disclosed in U.S. Pat. Nos. 6,101,116, 6,128,207, 6,256,216, 6,266,263, 6,373,739 and 6,496,399, assigned to the present assignee, the disclosures of which are hereby incorporated herein by reference. In addition, U.S. Pat. No. 6,522,562 to Foss, entitled "Content Addressable Memory Cell Having Improved Layout," discloses a CAM cell that uses p-channel transistors as SRAM access transistors. These p-channel transistors purportedly improve layout efficiency by providing a balanced number of p-channel and N-channel transistors within each CAM cell. In particular, FIG. 4 of the '562 patent illustrates a CAM half-cell that includes a 6T SRAM cell defined by two PMOS access transistors P3 and P4, two PMOS pull-up transistors P1 and P2 and two NMOS pull-down transistors N1 and N2. One half of a 4T compare circuit is also illustrated as including two NMOS transistors N3 and N4. Unfortunately, because PMOS transistors typically have lower mobility relative to equivalently-sized NMOS transistors, using PMOS transistors as access transistors within an SRAM cell may require relatively large PMOS transistors that increase overall unit cell size.

CAM cells having small unit cell size can also be achieved using lower transistor count dynamic CAM cells. For example, FIG. 5 of U.S. Pat. No. 6,188,594 to Ong, entitled "Reduced-Pitch 6-Transistor NMOS Content-Addressable-Memory Cell," discloses a 6T CAM cell having a non-unity layout aspect ratio.

CAM cells may be configured with NOR-type or NAND-type compare logic. In the case of NOR-type compare logic, a match line associated with a row of CAM cells is typically switched high-to-low upon detection of at least one "miss" in the row during a search operation. NOR-type compare logic typically provides for faster CAM cell operation during search operations with relatively high match line power consumption. Because of the parallel configuration of NOR-type compare logic, parasitic leakage currents through the compare logic transistors may provide a significant pull-down force on a match line and lead to search failure. In contrast, in NAND-type compare logic, a match line signal is propagated across the compare logic and lower match line power is typically consumed. For example, in the conventional ternary NAND-type CAM cell 20 of FIG. 2A. a match line signal may be propagated across at least one of two parallel paths of a four transistor (4T) compare logic circuit when a match condition is present or blocked from propagation when a miss condition is present. A first one of these two parallel paths is defined by transistor NA, which is responsive to a data signal (DX) applied during a search operation, and transistor NB, which is responsive to a signal generated at a storage node of an X memory cell (SRAM SX). A second one of these two parallel paths is defined by transistor NC, which is responsive to a data signal (DY) applied during a search operation, and transistor ND, which is responsive to a signal generated at a storage node of a Y memory cell (SRAM SY). Unfortunately, because CAM cells having the NAND-type compare logic illustrated by FIG. 2A require serial propagation of match line signals, NAND-type CAM devices are typically slower in operation relative to NOR-type CAM devices. This serial propagation of a match line signal is demonstrated by the pair of NAND-type CAM cells 20' of FIG. 2B. This pair of CAM cells 20' includes a left cell containing transistors NA1, NB1, NC1 and ND1 and a right cell containing transistors NA2, NB2, NC2 and ND2. A worst case propagation of a match line signal ML from the left of the left cell to the right of the right cell requires a propagation through four serially-connected transistors NA1, NB1 (or NC1, ND1) and NA2, NB2 (or NC2, ND2). Because of this configuration of conventional NAND-type CAM cells, which may require long serial paths for match line propagation in wide CAM arrays, there exists a need for NAND-type CAM devices having higher speed characteristics while retaining low power characteristics.

SUMMARY OF THE INVENTION

Embodiments of the present invention include ternary CAM cells having extremely small layout footprint size and efficient layout aspect ratios that enhance scalability and uniformity of wiring pitch. The ternary CAM cells also have high degrees of symmetry that facilitate extensive sharing of vias between transistor-equivalent half-cells. These shared vias provide electrical interconnects between terminals of the CAM cell transistors and bit, data and match lines. Accordingly, when the CAM half-cells are joined together on all four sides to form a large CAM array, a low per cell via count can be achieved.

First embodiments of the present invention include a 16T SRAM-based ternary CAM cell that extends in a semiconductor substrate and has a substantially square layout aspect ratio. In particular, the CAM cell includes first and second pairs of access transistors that extend adjacent a first side of the ternary CAM cell, and first and second pairs of cross-coupled inverters that extend adjacent a second side of the ternary CAM cell. First and second halves of a 4T compare circuit are also provided. The first half of the 4T compare circuit is positioned so that is extends between the first pair of access transistors and the first pair of cross-coupled inverters. Similarly, the second half of the 4T compare circuit is positioned so that it extends between the second pair of access transistors and the second pair of cross-coupled inverters.

The first pair of cross-coupled inverters include a first inverter having a first PMOS pull-up transistor and a first NMOS pull-down transistor therein, and a second inverter having a second PMOS pull-up transistor and a second NMOS pull-down transistor therein. To facilitate high cell density, the first and second NMOS pull-down transistors are positioned so that they extend between the first and second PMOS pull-up transistors (on one side) and the first half of the 4T compare circuit (on an opposite side). The second pair of cross-coupled inverters include a second pair of PMOS pull-up transistors and a second pair of NMOS pull-down transistors, which extend between the second pair of PMOS pull-up transistors and the second half of the 4T compare circuit.

According to preferred aspects of these embodiments, the first and second pairs of access transistors are equivalently-sized NMOS transistors having a first width/length (W/L) ratio and the 4T compare circuit comprises four equivalently-sized NMOS transistors having a second width/length ratio that is greater than the first width/length ratio. In some embodiments, the first width/length ratio is less than about 1.15 and the second width/length ratio is greater than about 1.15. More preferably, the first width/length ratio is about 1.04 and the second width/length ratio is about 1.25. The first pair of cross-coupled inverters comprises two equivalently-sized NMOS pull-down transistors having a third width/length ratio and two equivalently-sized PMOS pull-up transistors having a fourth width/length ratio that is less than the third width/length ratio. In some embodiments, the third width/length ratio is greater than about 1.5 and the fourth width/length ratio is less than about 1.25. More preferably, the third width/length ratio is about 1.8 and the fourth width/length ratio is about 1.0.

To achieve high degrees of scalability and support relatively uniform horizontal and vertical wiring pitches, a width/height aspect ratio of the ternary CAM cell is approximately square. In some embodiments, the width/height aspect ratio may be in a range from between about 1.08 and about 1.20. High density layouts can also be achieved by placing and orienting the MOS transistors of a CAM cell in orthogonal x and y directions that achieve a high packing density. In particular, a ternary CAM cell can be achieved having a footprint in a range from between about 3.0 $\mu m^2$ and about 3.6 $\mu m^2$.

Ternary CAM cells according to additional embodiments of the present invention include a first pair of NMOS access transistors having source and drain regions that are arranged in a y-direction in a first quadrant of the ternary CAM cell. A second pair of NMOS access transistors are also provided in a second quadrant of the ternary CAM cell and their source and drain regions are also arranged in the y-direction. The ternary CAM cell also includes first and second pairs of cross-coupled inverters that are positioned in fourth and third quadrants, respectively. The first pair of cross-coupled inverters comprises two PMOS pull-up transistors and two NMOS pull-down transistors that are arranged in an x-direction, which is orthogonal to the y-direction. Similarly, the second pair of cross-coupled inverters comprises two PMOS pull-up transistors and two NMOS pull-down transistors that are arranged in the x-direction. The ternary CAM cell also includes a 4T compare circuit that is divided into two halves. A first half of the 4T compare circuit is positioned between the first pair of access transistors and the first pair of cross-coupled inverters, and comprises two NMOS transistors that are arranged in the x-direction. Similarly, the second half of the 4T compare circuit is positioned between the second pair of access transistors and the second pair of cross-coupled inverters, and comprises two NMOS transistors arranged in the x-direction.

Still further embodiments of the present invention include a CAM array having a plurality of rows and columns of high-speed 4-bit NAND-type CAM cells therein. Each of a plurality of the NAND-type cells includes a respective ladder-type compare circuit having four two-transistor rungs, which support shorter length match lines and high match signal propagation speed during search operations. At least one of the plurality of rows includes a first 4-bit NAND-type CAM cell having a first ladder-type compare circuit with four two-transistor rungs and a second 4-bit NAND-type CAM cell having a second ladder-type compare circuit with four two-transistor rungs. A match line segment is also provided. This match line segment is connected to four source terminals of transistors in the first ladder-type compare circuit and four drain terminals of transistors in the second ladder-type compare circuit. According to further embodiments of the present invention, a NAND-type content addressable memory (CAM) cell is provided, which consists essentially of a first pair of SRAM memory cells, a second pair of SRAM memory cells and a ladder-type compare circuit having a first pair of two-transistor rungs and a second pair of two-transistor rungs. A layout of the first pair of SRAM memory cells is a mirror image of a layout of the second pair of SRAM memory cells and a layout of the first pair of two-transistor rungs is a mirror-image of a layout of the second pair of two-transistor rungs.

Many additional embodiments of the present invention are also provided, as described further herein.

DETAIL DESCRIPTION OF PREFERRED EMBODIMENTS

Figure 1B:
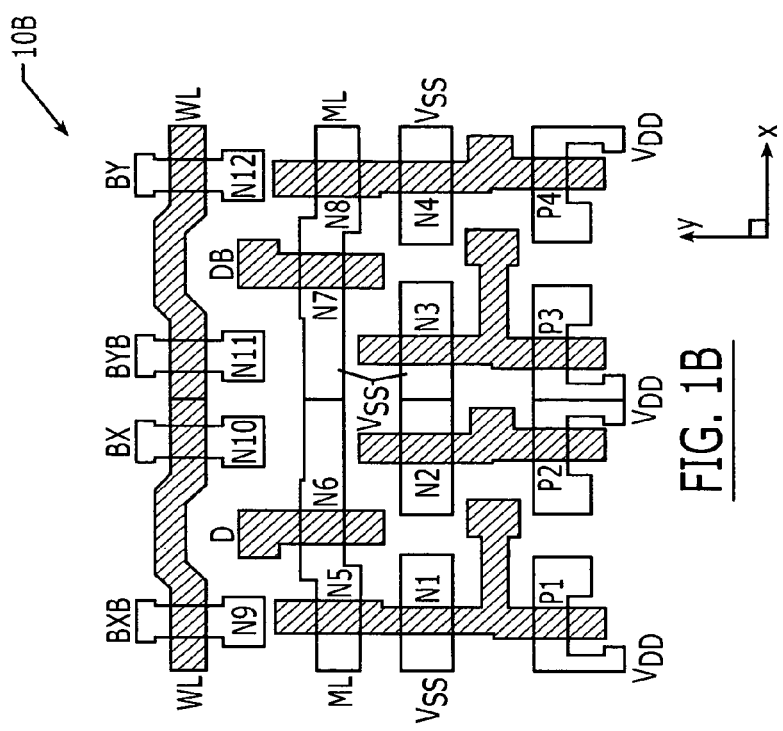
FIG. 1B is a layout schematic of the ternary CAM cell of FIG. 1A. The left-to-right and top-to-bottom orientation of the MOS transistors in the layout schematic match the orientation of the MOS transistors in the electrical schematic of FIG. 1A.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 1A:
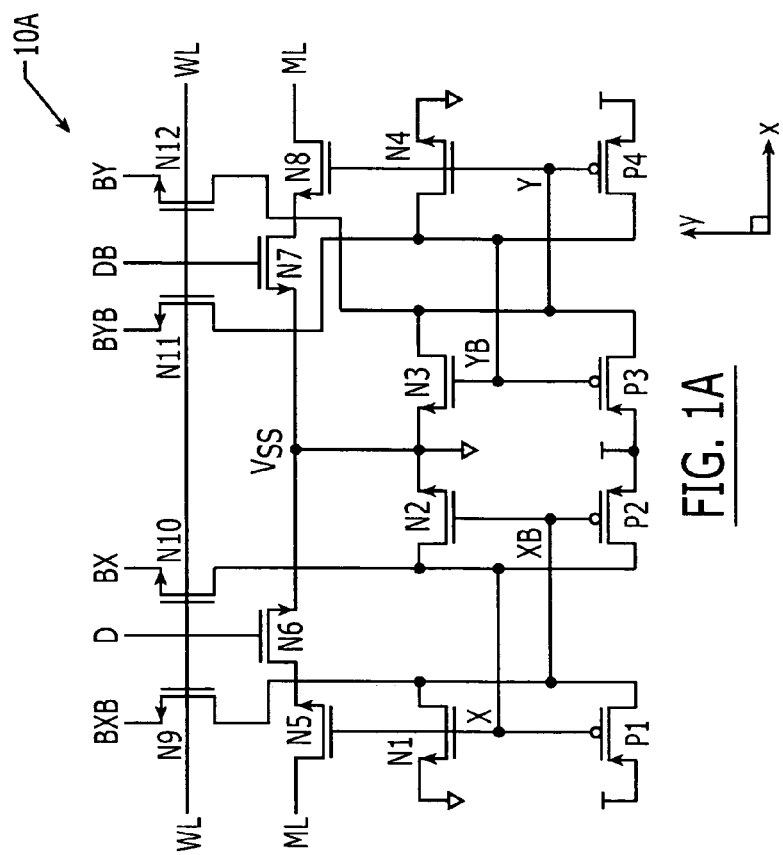
FIG. 1A is an electrical schematic of a ternary CAM cell according to an embodiment of the present invention.

Referring now to FIG. 1A, an electrical schematic of a ternary CAM cell 10A according to an embodiment of the present invention will be described. The ternary CAM cell 10A represents a sixteen transistor (16T) ternary CAM cell having two SRAM cells and a four transistor (4T) compare circuit therein. Each SRAM cell includes two access transistors and one pair of cross-coupled inverters that operate as a storage element. On the left side of FIG. 1A, a left half of the ternary CAM cell 10A is illustrated. This left half includes an X-SRAM storage element that generates an X output, which is provided to a left half of the 4T compare circuit. The X-SRAM storage element is defined by a first inverter, which consists of PMOS pull-up transistor P1 and NMOS pull-down transistor N1, and a second inverter, which consists of PMOS pull-up transistor P2 and NMOS pull-down transistor N2. The input of the first inverter is designated by the label X and the input of the second inverter is designated by the complementary label XB.

The input X of the first inverter is electrically connected to a first current carrying terminal of an NMOS access transistor N10. This first current carrying terminal of the NMOS access transistor N10 is illustrated as a drain terminal. The NMOS access transistor N10 has a gate terminal that is responsive to a word line signal WL and a second current carrying terminal that is responsive to a true bit line signal (shown as BX). The input XB of the second inverter is electrically connected to a first current carrying terminal of an NMOS access transistor N9. The NMOS access transistor N9 has a gate terminal that is responsive to the word line signal WL and a second current carrying terminal that is responsive to a complementary bit line signal (shown as BXB). The left half of the 4T compare circuit is defined by NMOS transistors N5 and N6, which are connected in series (i.e., source-to-drain) between a match line (ML) and a ground reference line (Vss). NMOS transistor N5 is configured to receive the signal X, which is the output of the second inverter defined by PMOS pull-up transistor P2 and NMOS pull-down transistor N2. NMOS transistor N6 is configured to receive a true data signal (shown as D), which represents the true bit of a comparand that is applied to the ternary CAM cell 10A during a search operation.

The right half of the ternary CAM cell 10A includes a Y-SRAM storage element that generates an output to a right half of the 4T compare circuit. The Y-SRAM storage element is defined by a third inverter, which consists of PMOS pull-up transistor P3 and NMOS pull-down transistor N3, and a fourth inverter, which consists of PMOS pull-up transistor P4 and NMOS pull-down transistor N4. The input of the fourth inverter is designated by the label Y and the input of the third inverter is designated by the label YB. The input Y of the fourth inverter is electrically connected to a first current carrying terminal of NMOS access transistor N12. The NMOS access transistor N12 has a gate terminal that is responsive to the word line signal WL and a second current carrying terminal that is responsive to a true bit line signal (shown as BY).

The input YB of the third inverter is electrically connected to a first current carrying terminal of NMOS access transistor N11. The NMOS access transistor N11 has a gate terminal that is responsive to the word line signal WL and a second current carrying terminal that is responsive to a complementary bit line signal (shown as BYB). The right half of the 4T compare circuit is defined by NMOS transistors N7 and N8, which are connected in series (i.e., source-to-drain) between a match line (ML) and a ground reference line (Vss). NMOS transistor N8 is configured to receive the signal Y, which is the output of the third inverter defined by PMOS pull-up transistor P3 and NMOS pull-down transistor N3. NMOS transistor N7 is configured to receive a complementary data signal (shown as DB), which represents the complementary bit of the aforementioned comparand.

Based on the illustrated configuration of the transistors and interconnections within the cell embodiment of FIG. 1A, the ternary CAM cell 10A is configured to support three valid states in accordance with TABLE 1:

TABLE 1

| X | Y | STATE |
|---|---|-------|
| 0 | 0 | MASK |
| 0 | 1 | 0 |
| 1 | 0 | 1 |
| 1 | 1 | INVALID |

Similarly, by reversing the positions of the differential data lines (D and DB) within the CAM array, the CAM cell 10A will support the three valid states illustrated by TABLE 2:

TABLE 2

| X | Y | STATE |
|---|---|-------|
| 0 | 0 | MASK |
| 0 | 1 | 1 |
| 1 | 0 | 0 |
| 1 | 1 | INVALID |

The electrical schematic of the ternary CAM cell 10A illustrated by FIG. 1A corresponds to the layout schematic of the ternary CAM cell 10B illustrated by FIG. 1B. Thus, in FIG. 1A, the lateral (left-to-right) orientation of PMOS pull-up transistors P1–P4 and NMOS transistors N1–N8 represents the lateral x-direction orientation of the PMOS pull-up transistors P1–P4 and the NMOS transistors N1–N8 illustrated by FIG. 1B. Likewise, the vertical (top-to-bottom) orientation of NMOS access transistors N9–N12 represents the vertical y-direction orientation of the NMOS access transistors N9–N12 illustrated by FIG. 1B. As will be understood by those skilled in the art, the open (i.e., unshaded) polygons in the layout of FIG. 1B represent source/drain diffusion patterns and the shaded polygons represent gate "poly" patterns (i.e., polysilicon patterns). Thus, in FIG. 1B, the source-to-drain direction (i.e., channel length direction) of the PMOS pull-up transistors P1–P4 and the NMOS transistors N1–N8 corresponds to the x-direction and the source-to-drain direction of the NMOS access transistors N9–N12 corresponds to the y-direction.

In the ternary CAM cell 10B, the gate poly patterns associated with PMOS pull-up transistor P1, NMOS pull-down transistor N1 and NMOS transistor N5 are joined into one contiguous pattern, to represent a portion of the signal line X in FIG. 1A. Similarly, the contiguous gate poly pattern associated with PMOS pull-up transistor P2 and NMOS pull-down transistor N2 represents a portion of the signal line XB in FIG. 1A. The contiguous gate poly pattern associated with PMOS pull-up transistor P3 and NMOS pull-down transistor N3 represents a portion of the signal line YB in FIG. 1A. The contiguous gate poly pattern associated with PMOS pull-up transistor P4 and NMOS pull-down transistor N4 represents a portion of the signal line Y in FIG. 1A. The gate poly patterns associated with NMOS transistor N6 and NMOS transistor N7 represent portions of the true and complementary connections to the true data line D and the complementary data line DB, respectively. The single gate poly pattern that extends laterally across the top side of the ternary CAM cell 10B represents a word line (WL).

The reference labels BXB, BX, BYB and BY, which run along the top side of the ternary CAM cell 10B, represent the source regions of access transistors that are electrically connected (by vias) to two pairs of differential bit lines. The reference labels ML represents the drain regions of two NMOS transistors N5 and N8 that are electrically connected (by vias) to a match line (not shown), which is typically formed at a higher level of metallization. The reference labels Vss represent the source regions of NMOS transistors N1–N4 and N6–N7, which are electrically connected (by vias) to a ground reference line. Finally, the reference labels Vdd represent the drain regions of PMOS pull-up transistors P1–P4, which are electrically connected (by vias) to a power supply line (e.g., Vdd=1 Volt).

Figures 1C, 1D:
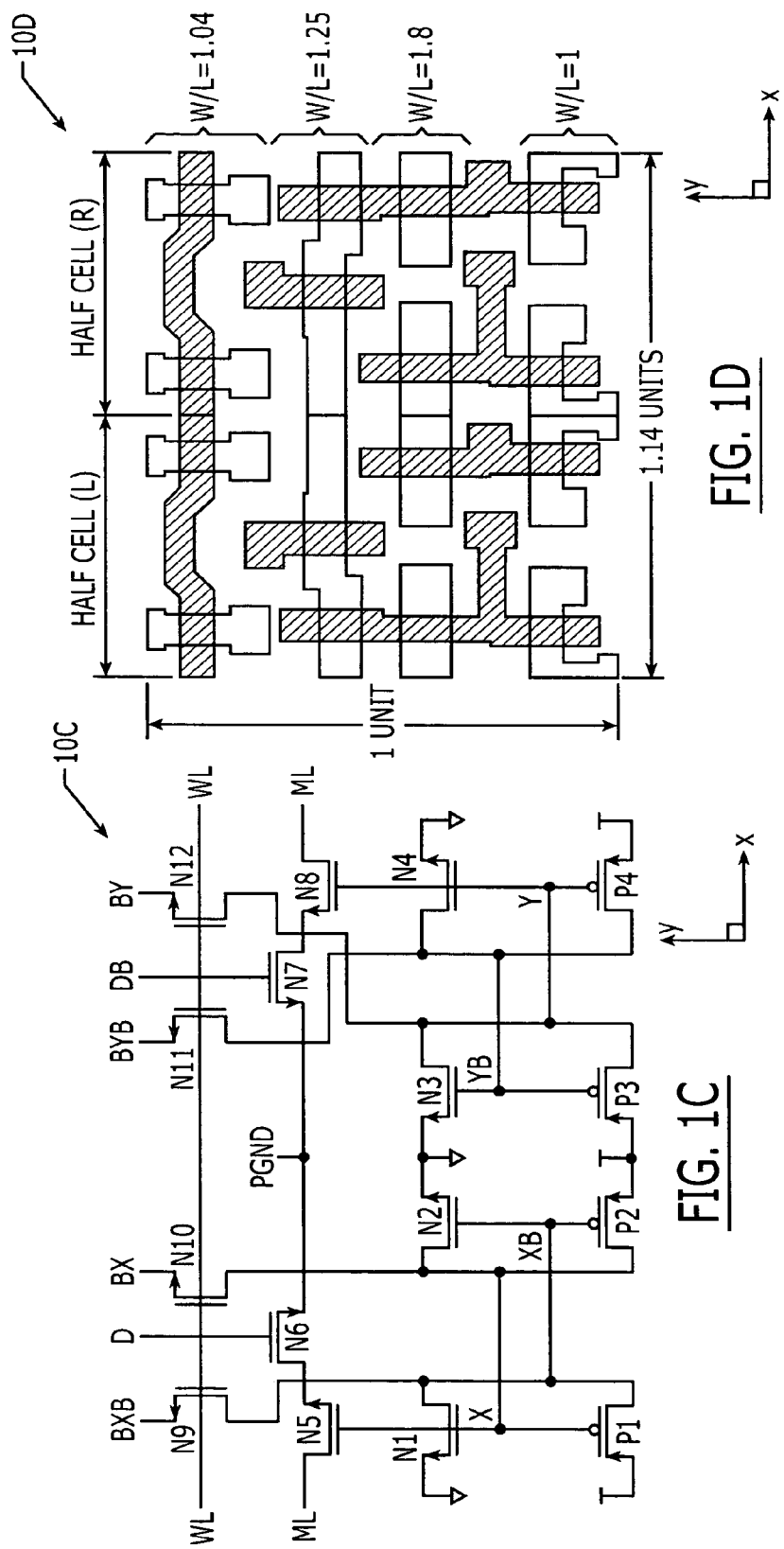
FIG. 1C is an electrical schematic of a ternary CAM cell that is similar to the embodiment of FIG. 1A, however, a pseudo-ground (PGND) connection is provided.
FIG. 1D is a layout schematic of the ternary CAM cell of FIG. 1B, with layout aspect ratio and transistor size information provided.

Referring now to FIG. 1C, a 16T ternary CAM cell 10C according to another embodiment of the present invention is illustrated. This CAM cell 10C is essentially identical to the ternary CAM cell 10A of FIG. 1A, however, the source terminals of NMOS transistors N6 and N7 within the 4T compare circuit are connected to a switchable pseudo-ground line (PGND), instead of a fixed ground reference line (Vss). The use of switchable pseudo-ground lines to enhance performance of ternary CAM arrays in certain applications is more fully described in U.S. application Ser. Nos.: 10/0084,842 to Lien et al., filed Feb. 27, 2002; 10/306,799 to Lien et al., filed Nov. 27, 2002; and 10/323,236 to Park et al., filed Dec. 18, 2002, the disclosures of which are hereby incorporated herein by reference.

As illustrated by the ternary CAM cell 10D of FIG. 1D, the layout of the CAM cell of FIGS. 1A–1B includes two half-cells, left and right. These two half-cells have equivalent transistor count and the source/drain diffusion regions of these half-cells are mirror images of each other. As illustrated more fully by FIG. 1F, these half-cells may be replicated side-by-side in an alternating left/right half-cell sequence to form a row of CAM cells (e.g., a x80 row). Moreover, the CAM cell 10D of FIG. 1D and a mirror image of this cell when rotated about the x-axis, will result in a pair of cells that may be replicated side-by-side to define two adjacent rows of CAM cells within a CAM array. These two adjacent rows of CAM cells may be stacked vertically to define an array having a large number of rows and columns of CAM cells 10D therein.

FIG. 1D also illustrates how the layout of the ternary CAM cells 10A–10D results in a width-to-height layout aspect ratio that is substantially square. In particular, in order to enhance scalability and uniformity of wiring pitch (in both x and y directions), it is preferred that the width/height aspect ratio be in a range from between about 1.08 and about 1.20 and, more preferably, about 1.14. Factors which influence the aspect ratio include the placement, size and orientation of the sixteen transistors within a cell. As described more fully hereinbelow, the placement and orientation is chosen so that the resulting CAM cell has essentially identical left and right half-cells. These half-cells may share all ML, Vss and Vdd vias with adjacent half-cells in a same row of a CAM array, and also share all bit line and data line vias (e.g., BXB, BX, BYB, BY, D and DB) with adjoining cells in a same column of the CAM array. Moreover, using deep sub-micron CMOS processes, including the NeXsys™ 90-nanometer process technology developed by Taiwan Semiconductor Manufacturing Company, Ltd., a small layout footprint in a range from between about 3.0 µm² and about 3.6 µm² can be achieved for the CAM cells illustrated herein. This 90-nanometer process technology supports a core supply voltage (Vdd) ranging from 1.0 Volts to 1.2 Volts with an I/O and analog block supply voltage ranging from 1.8 Volts to 3.3 Volts.

The sixteen transistors within the ternary CAM cell 10D are also sized to achieve preferred operating characteristics including high soft-error immunity characteristics. A proper balance is also struck between the contribution of each cell to the bit line, data line and match line capacitance and cell speed. One significant design consideration is the speed/power tradeoff between the match line pull-down strength of each cell and its contribution to match line capacitance, which is a significant consumer of match line power during search operations. To achieve a proper balance of these and other design parameters, the first and second pairs of access transistors are equivalently-sized NMOS transistors and the NMOS transistors within the 4T compare circuit are also equivalently-sized. More particularly, the first and second pairs of access transistors N9–N10 and N11–N12 are equivalently-sized NMOS transistors having a first width/length (W/L) ratio. The 4T compare circuit comprises four equivalently-sized NMOS transistors N5–N8 having a second width/length ratio that is greater than the first width/length ratio. It is preferable that the first width/length ratio be less than about 1.15 and the second width/length ratio be greater than about 1.15. More preferably, the first width/length ratio is about 1.04 and the second width/length ratio is about 1.25, as illustrated by FIG. 1D.

The first and second pairs of cross-coupled inverters are also configured to have equivalently-sized NMOS pull-down transistors N1–N2 and N3–N4 having a third width/length ratio, and equivalently-sized PMOS pull-up transistors P1–P2 and P3–P4 having a fourth width/length ratio. The third width/length ratio is greater than the fourth width/length ratio. It is preferable that the third width/length ratio is greater than about 1.5 and the fourth width/length ratio is less than about 1.25. More preferably, the third width/length ratio is about 1.8 and the fourth width/length ratio is about 1.0, as illustrated by FIG. 1D.

Figure 1E:
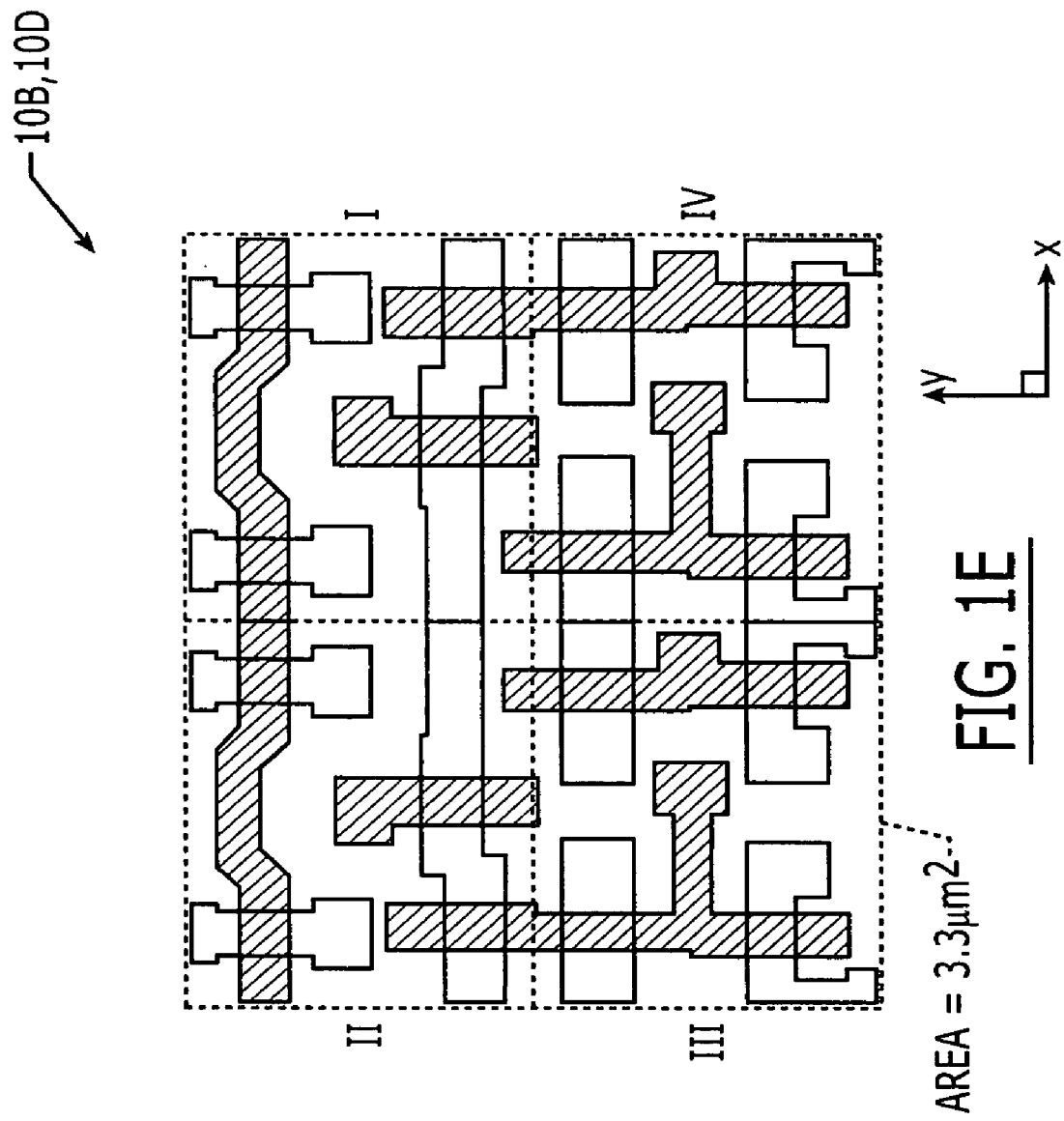
FIG. 1E is a layout schematic of the ternary CAM cells of FIGS. 1B and 1D, with dotted lines that show the positions of various transistors within four quadrants of a substantially square CAM cell.

Referring now to FIG. 1E, the layout patterns of the CAM cells 10B and 10D illustrated by FIGS. 1B and 1D are shown as being divided into four quadrants, I–IV, which occupy a layout footprint of 3.3 µm². Quadrant I is illustrated as including the right pair of access transistors and the right half of the 4T compare circuit. Similarly, Quadrant II is illustrated as including the left pair of access transistors and the left half of the 4T compare circuit. Quadrant IV is illustrated as including two cross-coupled inverters, which define a storage element within an SRAM cell. These two cross-coupled inverters are defined by two NMOS pull-down transistors and two PMOS pull-up transistors, shown as N3–N4 and P3–P4 in FIGS. 1A–1C. Similarly, Quadrant III is illustrated as including two cross-coupled inverters, which comprise two NMOS pull-down transistors and two PMOS pull-up transistors, shown as N1–N2 and P1–P2 in FIGS. 1A–1C. Thus, each quadrant of the CAM cell 10B, 10D illustrated by FIG. 1E contains an equivalent number of transistors.

Figure 1F:
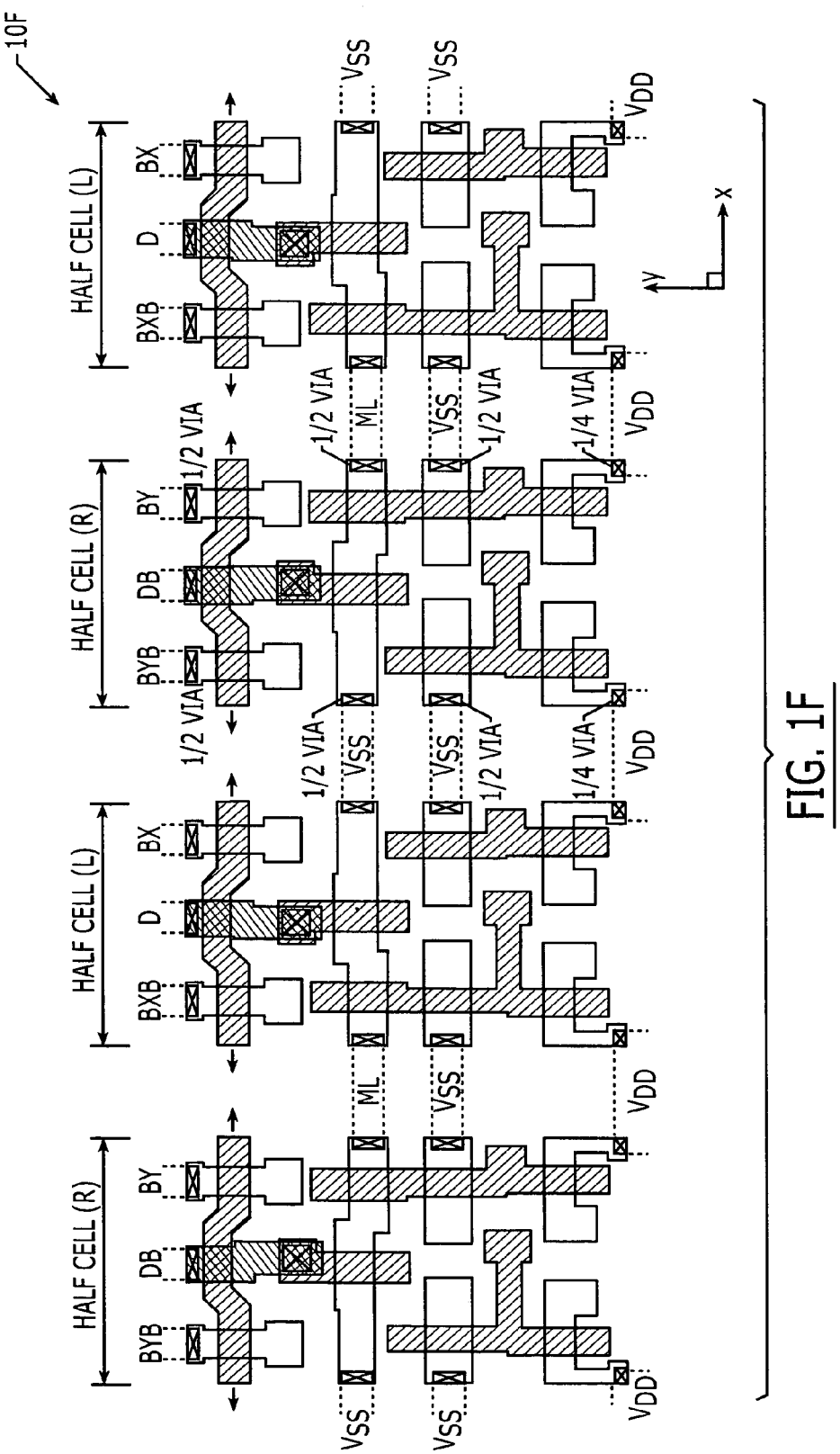
FIG. 1F is a separated layout view of four half-cells with half-via and quarter-via patterns illustrated.
Figure 2A:
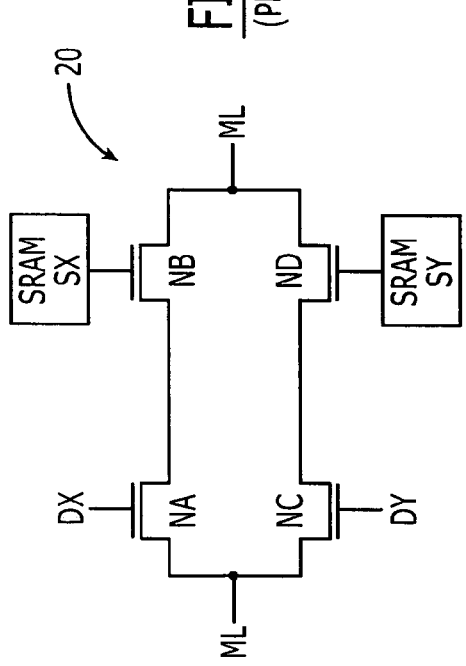
FIG. 2A is a simplified electrical schematic of a conventional ternary NAND CAM cell.
Figure 2B:
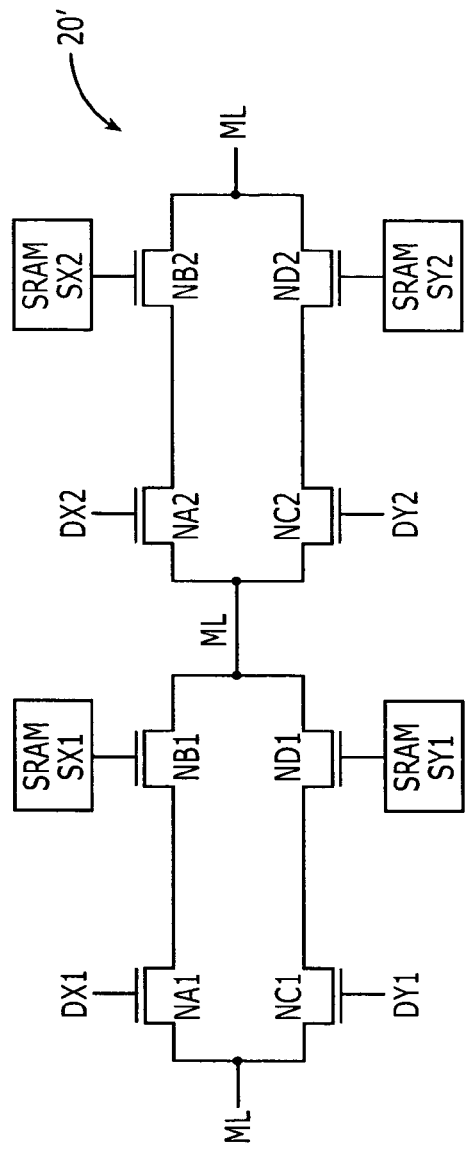
FIG. 2B is a simplified electrical schematic of a pair of the ternary NAND CAM cells of FIG. 2A.

In FIG. 1F, two pairs of CAM half-cells that are arranged within a row of a CAM array are identified by the reference numeral 10F. These half-cells are similar to those illustrated by FIG. 1D, however, numerous via connection patterns have been added to highlight the extensive via sharing between adjacent half-cells in both the x and y directions, when the half-cells are joined together to define a two-dimensional array of CAM cells. These via connections may illustrate: CO contact holes from first level metallization (M1) to the poly gate patterns or source/drain diffusion patterns, VIA1 holes connecting the first level metallization to second level metallization (M2) (not shown) or VIA2 holes connection the second level metallization to third level metallization (not shown). For example, the poly gates of NMOS transistors N6 and N7, which are illustrated by the reference labels D and DB in FIG. 1B, are illustrated as being connected through CO contact holes to respective first level metallization patterns that have been added to FIG. 1F. These first level metallization patterns are shaded in the reverse direction relative to the poly gate patterns. Moreover, according to preferred aspects of these half-cell layouts, the via connections to power supply lines (Vdd), ground reference lines (Vss), match lines (ML), and bit and data lines (shown as BYB, BY, BXB, BX, D and DB) are positioned along the outer periphery of each half-cell in order to achieve high degrees of via sharing (½Via or ¼Via) between adjacent half-cells in both the x and y directions. This high degree of via sharing contributes to a smaller layout footprint having a substantially square aspect ratio.

Figure 3A:
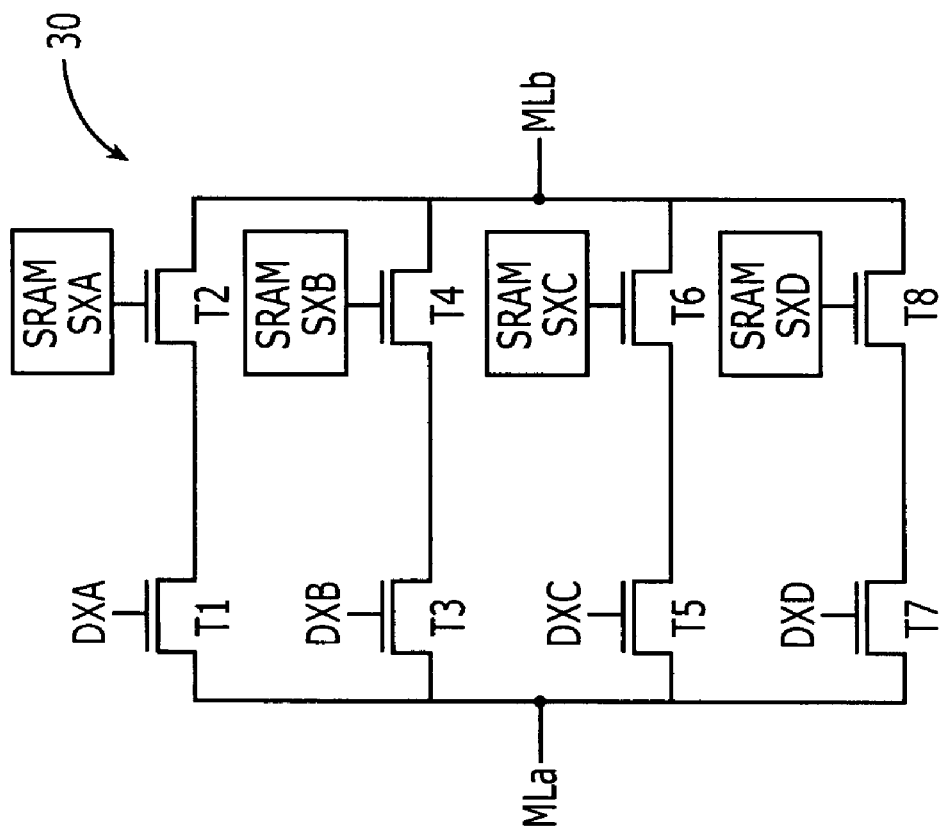
FIG. 3A is a simplified electrical schematic of a NAND-type CAM cell according to embodiments of the present invention.

FIG. 3A illustrates a simplified electrical schematic of a NAND-type CAM cell 30 according to another embodiment of the present invention. This CAM cell 30, which is also referred to herein as an ABCD CAM cell, includes four memory cells and a ladder-type compare circuit. The four memory cells are illustrated as static random access memory (SRAM) cells (SXA, SXB, SXC and SXD), however, other types of memory cells (e.g., DRAM cells) may be used. The ladder-type compare circuit contains four parallel rungs for the case where four bits of data are stored within the CAM cell 30. The first rung includes two NMOS transistors connected in series (i.e., source-to-drain). These two NMOS transistors are shown as T1 and T2. This first rung becomes conductive to thereby short a left side match line segment (MLa) to a right match line segment (MLb) when an applied data signal DXA and an output (e.g., storage node output) of the memory cell SRAM SXA are both set to logic 1 values. Similarly, the second rung of the compare circuit includes transistors T3 and T4. This second rung becomes conductive when an applied data signal DXB and an output of the memory cell SRAM SXB are both set to logic 1 values. The third rung of the compare circuit includes transistors T5 and T6. This third rung becomes conductive when an applied data signal DXC and an output of the memory cell SRAM SXC are both set to logic 1 values. The fourth rung of the compare circuit includes transistors T7 and T8. This fourth rung becomes conductive when an applied data signal DXD and an output of the memory cell SRAM SXD are both set to logic 1 values. As described more fully hereinbelow with respect to TABLE 3, three or more rungs may be simultaneously conductive during a search/compare operation. Simultaneous conduction across three or more rungs of the compare circuit facilitates higher match signal propagation speed across fewer match line segments (i.e., shorter overall match line length) and shorter duration search cycles. Other aspects of NAND-type CAM devices are disclosed in Provisional Application No. 60/626,809, filed Nov. 9, 2004, the disclosure of which is hereby incorporated herein by reference.

Figure 3B:
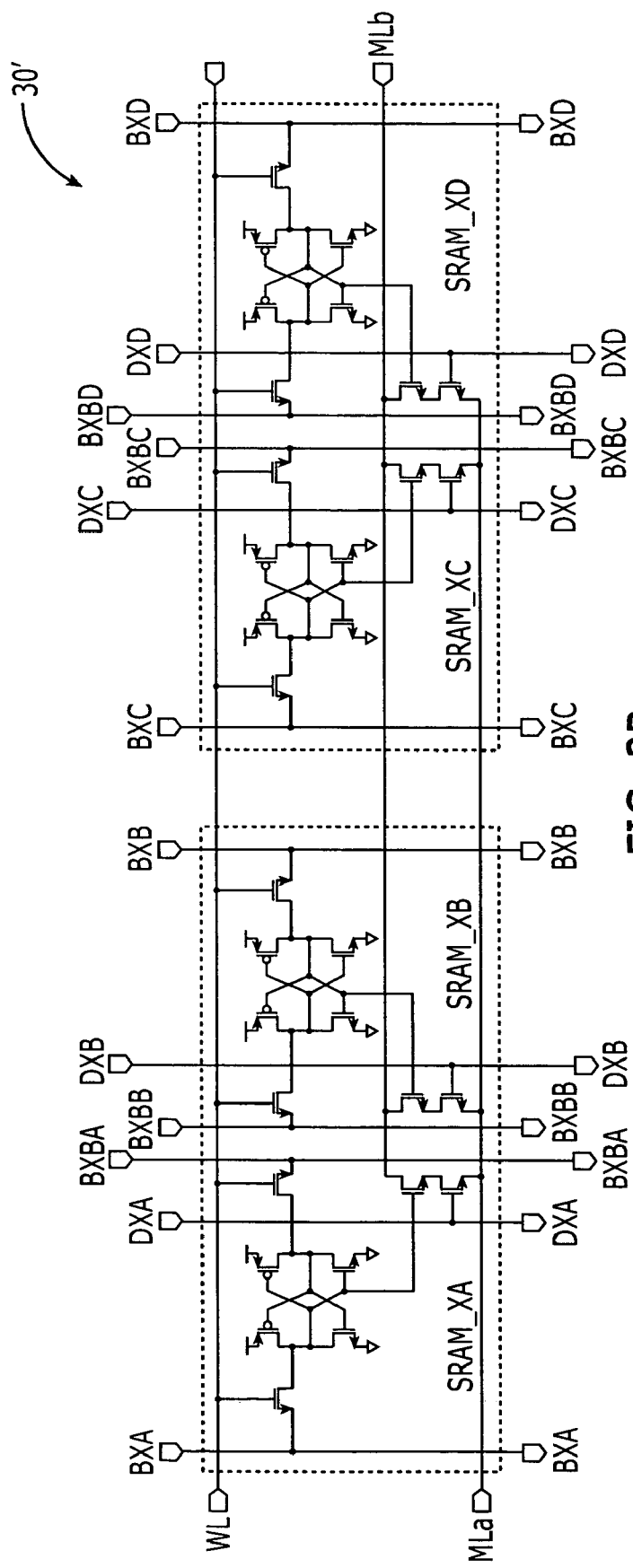
FIG. 3B is a detailed electrical schematic of one embodiment of the NAND-type CAM cell of FIG. 3A.

FIG. 3B illustrates in greater detail a NAND-type CAM cell 30' containing four SRAM memory cells and a ladder-type compare circuit having four rungs. This ladder-type compare circuit is coupled at opposite ends to two segments of a match line, which are shown as MLa and MLb. The four memory cells are illustrated as SRAM memory cells: SRAM_XA, SRAM_XB, SRAM_XC and SRAM_XD. Each of the memory cells is coupled to a corresponding pair of differential bit lines: (BXA, BXBA), (BXB, BXBB), (BXC, BXBC) and (BXD, BXBD). Data can be written to and read from the memory cells by driving the shared word line WL low-to-high during a write or read cycle to thereby turn on the NMOS access transistors within the memory cells. Each of the rungs of the ladder-type compare circuit includes two NMOS transistors. A first one of the rungs is responsive to a data signal DXA, provided on a corresponding data line during search operations, and an output of a storage node (node A) of SRAM_XA. A second one of the rungs is responsive to a data signal DXB and an output of a storage node (node B) of SRAM_XB. A third one of the rungs is responsive to a data signal DXC and an output of a storage node (node C) of SRAM_XC. A fourth one of the rungs is responsive to a data signal DXD and an output of a storage node (node D) of SRAM_XD.

Figure 3C:
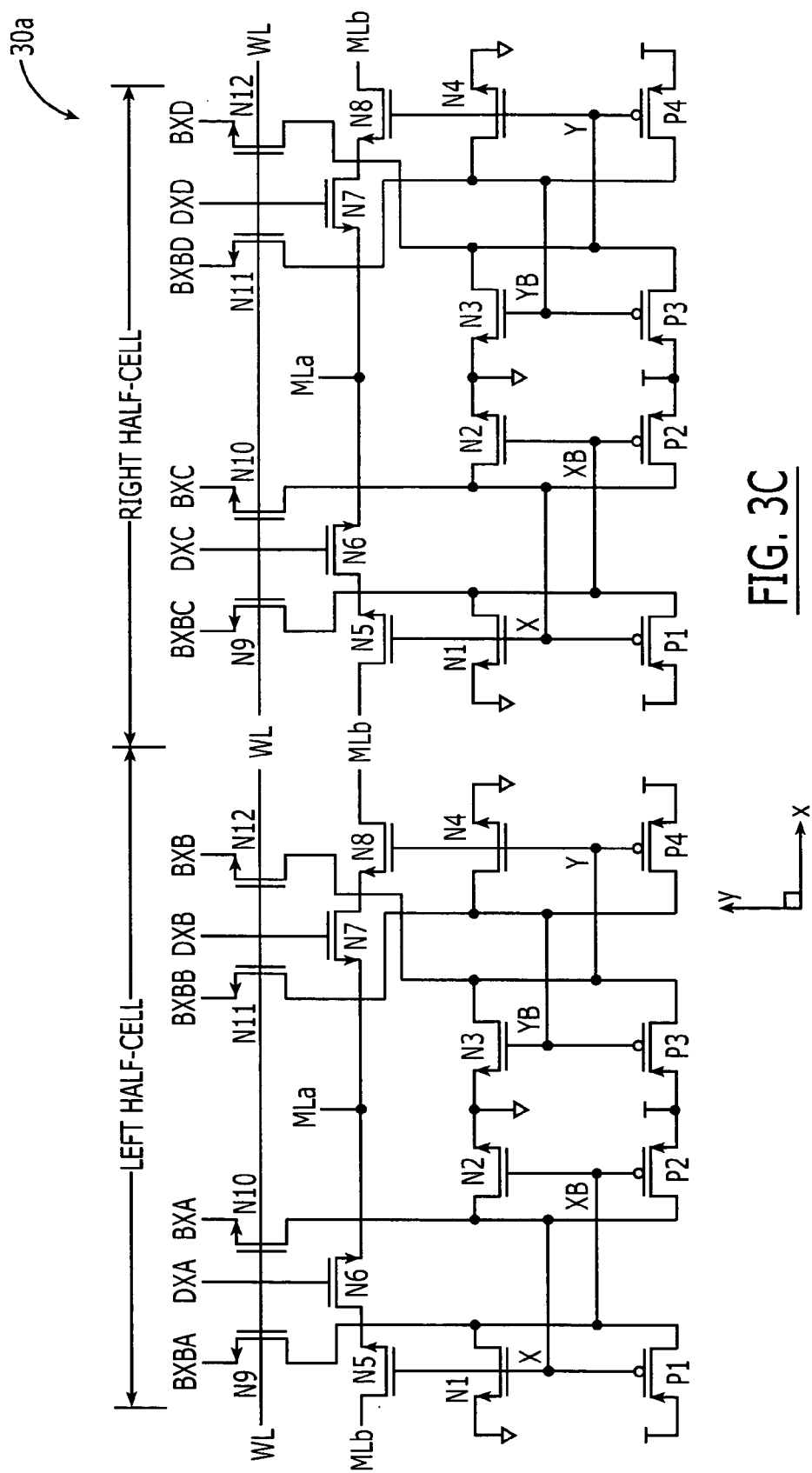
FIG. 3C is an electrical schematic of the NAND-type CAM cell of FIG. 3B, which shows placement and orientation of transistors within compare and memory cell logic.
Figure 3D:
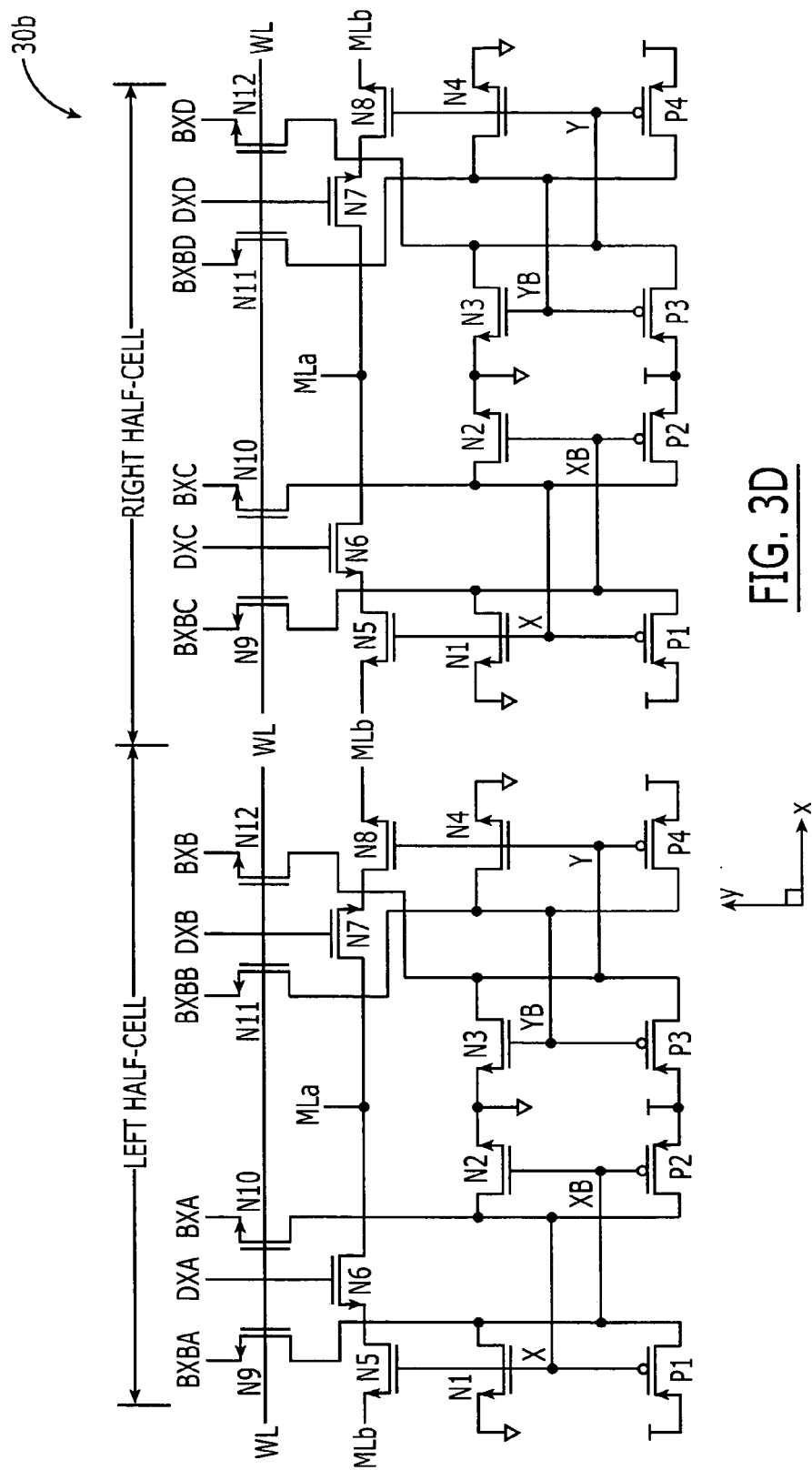
FIG. 3D is a detailed electrical schematic of the NAND-type CAM cell of FIG. 3A, which shows placement and orientation of transistors within compare and memory cell logic.

The layout of the NAND-type CAM cell 30' of FIG. 3B on an integrated circuit chip may utilize two side-by-side placements of the ternary CAM cell 10A of FIG. 1A, with slight modifications that account for the ladder-type compare logic having four rungs. These modifications are illustrated by the NAND-type CAM cell 30a of FIG. 3C, which shows how one match line segment MLb is connected to the drain terminals of NMOS transistors N8 (right and left side) and NMOS transistors N5 (right and left side). The source terminals of NMOS transistors N6 (right and left side) and NMOS transistors N7 (right and left side) are connected to another match line segment MLa. The NAND-type CAM cell 30a of FIG. 3C may be placed side-by-side with the NAND-type CAM cell 30b of FIG. 3D, so that an alternating relationship between match line segments MLa and MLb is provided across a row of NAND-type CAM cells. In FIG. 3D, a match line segment MLb is connected to the source terminals of NMOS transistors N5 and N8 in the left half-cell and the source terminals of NMOS transistors N5 and N8 in the right half-cell. In addition, another match line segment MLa is connected to the drain terminals of NMOS transistors N6 and N7 in the left half-cell and the drain terminals of NMOS transistors N6 and N7 in the right half-cell.

Figure 3E:
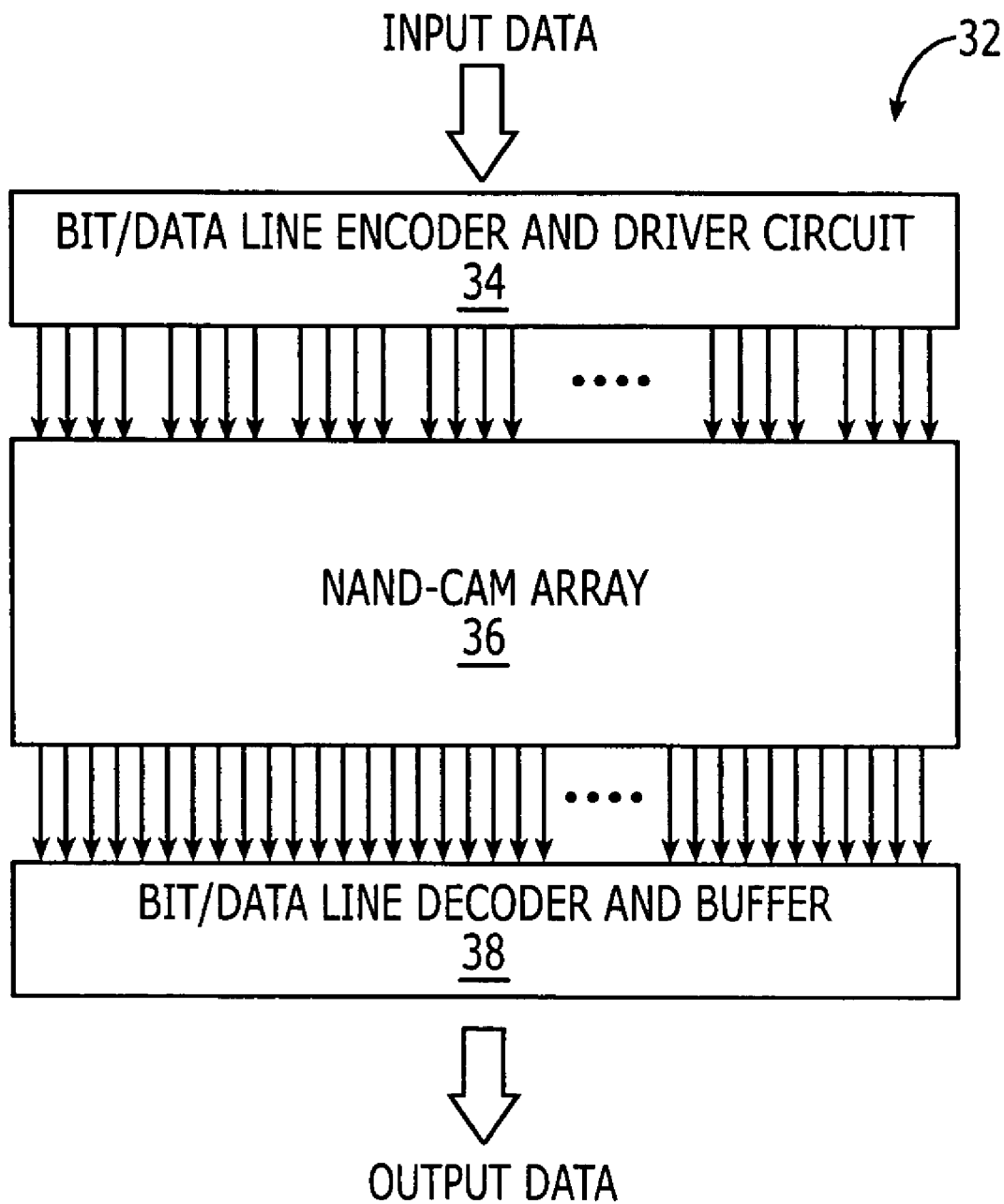
FIG. 3E is a block diagram of a CAM array block according to embodiments of the present invention.

As illustrated by FIG. 3E, the NAND-type CAM cells illustrated by FIGS. 3A–3D may be provided in a CAM system 32 having a large capacity CAM array 36 therein. The CAM array 36 may be configured to support a large number of rows and columns of NAND-type CAM cells. If the CAM system 32 supports 80-bit wide data entries, for example, then each row within the CAM array 36 may include 40 of the NAND-type CAM cells described herein. These 40 NAND-type CAM cells may be provided as an alternating arrangement of the CAM cells 30a and 30b. The data and bit lines (e.g, DXA, DXB, DXC and DXD and (BXA, BXBA), (BXB, BXBB), (BXC, BXBC) and (BXD, BXBD)) that span the CAM array 36 are electrically coupled to a bit/data line encoder and driver circuit 34, which may be configured to perform the encoding operations illustrated by TABLES 3–4 hereinbelow. The bit lines that span the CAM array 36 may also be electrically coupled to a bit/data line decoder and buffer circuit 38, which receives data from the CAM array 36 during read operations. As illustrated, the encoder/driver circuit 34 receives input data and the decoder/buffer circuit 38 generates output data. This input data may be quaternary data that takes the form of data (D) and mask (M) bits in some embodiments of the invention.

Each of the NAND-type CAM cells illustrated by FIGS. 3A–3D retains four bits of encoded data, shown herein as data bits A, B, C and D. As illustrated by TABLE 3, these four bits of encoded data map from four bits of input data. These four bits of input data can take the form of data appropriate for two quaternary NOR-type CAM cells (QCAM) (i.e., D0, M0, D1, M1), two ternary NOR-type XY CAM cells (TCAM) (i.e., X0, Y0, X1, Y1) or two ternary NAND-type CAM cells (i.e., X0, Y0, X1, Y1) of conventional design. In the case of two NOR-type QCAM cells, the four bits of input data support sixteen (16) unique four-bit data vectors {(0,0,0,0), (0,0,0,1), . . . , (1,1,1,1)},which are illustrated on the left side of TABLE 3.

TABLE 3

| NOR Q_CAM | | | | NOR T_CAM | | | | NAND T_CAM | | | | ABCD CAM | | | |
|---|---|---|---|---|---|---|---|---|---|---|---|---|---|---|---|
| | | | | X0 | Y0 | X1 | Y1 | X0 | Y0 | X1 | Y1 | | | | |
| D0 | M0 | D1 | M1 | D | DB | D | DB | D | DB | D | DB | A | B | C | D |
| 0 | 1 | 0 | 1 | 1 | 0 | 1 | 0 | 0 | 1 | 0 | 1 | 1 | 0 | 0 | 0 |
| 1 | 1 | 0 | 1 | 0 | 1 | 1 | 0 | 1 | 0 | 0 | 1 | 0 | 1 | 0 | 0 |
| 0 | 1 | 1 | 1 | 1 | 0 | 0 | 1 | 0 | 1 | 1 | 0 | 0 | 0 | 1 | 0 |
| 1 | 1 | 1 | 1 | 0 | 1 | 0 | 1 | 1 | 0 | 1 | 0 | 0 | 0 | 0 | 1 |
| 0 | 0 | 0 | 1 | 0 | 0 | 1 | 0 | 1 | 0 | 1 | 1 | 1 | 0 | 0 |
| 1 | 0 | 0 | 1 | 0 | 0 | 1 | 0 | 1 | 1 | 0 | 1 | 1 | 1 | 0 | 0 |
| 0 | 0 | 1 | 1 | 0 | 0 | 0 | 1 | 1 | 1 | 0 | 0 | 0 | 1 | 1 |
| 1 | 0 | 1 | 1 | 0 | 0 | 0 | 1 | 1 | 1 | 0 | 0 | 0 | 1 | 1 |
| 0 | 1 | 0 | 0 | 1 | 0 | 0 | 0 | 1 | 1 | 1 | 1 | 0 | 1 | 0 |
| 1 | 1 | 0 | 0 | 0 | 1 | 0 | 0 | 1 | 0 | 1 | 1 | 1 | 0 | 1 | 0 |
| 0 | 1 | 1 | 0 | 1 | 0 | 0 | 0 | 0 | 1 | 1 | 1 | 0 | 1 | 0 | 1 |
| 1 | 1 | 1 | 0 | 0 | 1 | 0 | 0 | 1 | 0 | 1 | 1 | 0 | 1 | 0 | 1 |
| 0 | 0 | 0 | 0 | 0 | 0 | 0 | 0 | 1 | 1 | 1 | 1 | 1 | 1 | 1 | 1 |
| 1 | 0 | 0 | 0 | 0 | 0 | 0 | 0 | 1 | 1 | 1 | 1 | 1 | 1 | 1 | 1 |
| 0 | 0 | 1 | 0 | 0 | 0 | 0 | 0 | 1 | 1 | 1 | 1 | 1 | 1 | 1 | 1 |
| 1 | 0 | 1 | 0 | 0 | 0 | 0 | 0 | 1 | 1 | 1 | 1 | 1 | 1 | 1 | 1 |

These sixteen (16) unique four-bit data vectors map to nine (9) unique four-bit vectors associated with the ABCD CAM cells described herein. Thus, as illustrated by TABLE 3 and TABLE 4.1, an input data vector of (D0,M0,D1,M1)=(0101) would be converted by the bit/data line encoder and driver circuit 34 to an ABCD vector equivalent to (1000). Likewise, as illustrated by TABLE 3 and TABLE 4.3, an input data vector of (D0,M0,D1,M1)=(0110) would be converted by the bit/data line encoder and driver circuit 34 to an ABCD vector equivalent to (0101). Each ABCD vector is applied to the corresponding quad group of data lines DXA-DXD during search operations or applied as differential rail-to-rail data to a quad grouping of bit line pairs (BXA, BXBA)—(BXD, BXBD) during write operations. Collectively, TABLES 4.1–4.4 illustrate the encoding of all sixteen combinations of four bit data vectors into ABCD vectors that are compatible with the NAND-type CAM cells illustrated by FIGS. 3A–3D.

TABLE 4.1

| INCOMING DATA (COMBINATIONS 1–4) | | | | | | | | | | | | | | | |
|---|---|---|---|---|---|---|---|---|---|---|---|---|---|---|---|
| D0 | M0 | D1 | M1 | D2 | M2 | D3 | M3 | D4 | M4 | D5 | M5 | D6 | M6 | D7 | M7 |
| 0 | 1 | 0 | 1 | 1 | 1 | 0 | 1 | 0 | 1 | 1 | 1 | 1 | 1 | 1 | 1 |
| ENCODER OUTPUT | | | | | | | | | | | | | | | |
| DXA 0 | DXB 0 | DXC 0 | DXD 0 | DXA 1 | DXB 1 | DXC 1 | DXD 1 | DXA 2 | DXB 2 | DXC 2 | DXD 2 | DXA 3 | DXB 3 | DXC 3 | DXD 3 |
| 1 | 0 | 0 | 0 | 0 | 1 | 0 | 0 | 0 | 0 | 1 | 0 | 0 | 0 | 0 | 1 |

TABLE 4.2

| INCOMING DATA (COMBINATIONS 5–8) | | | | | | | | | | | | | | | |
|---|---|---|---|---|---|---|---|---|---|---|---|---|---|---|---|
| D0 | M0 | D1 | M1 | D2 | M2 | D3 | M3 | D4 | M4 | D5 | M5 | D6 | M6 | D7 | M7 |
| 0 | 0 | 0 | 1 | 1 | 0 | 0 | 1 | 0 | 0 | 1 | 1 | 1 | 0 | 1 | 1 |
| ENCODER OUTPUT | | | | | | | | | | | | | | | |
| DXA 0 | DXB 0 | DXC 0 | DXD 0 | DXA 1 | DXB 1 | DXC 1 | DXD 1 | DXA 2 | DXB 2 | DXC 2 | DXD 2 | DXA 3 | DXB 3 | DXC 3 | DXD 3 |
| 1 | 1 | 0 | 0 | 1 | 1 | 0 | 0 | 0 | 0 | 1 | 1 | 0 | 0 | 1 | 1 |

TABLE 4.3

| INCOMING DATA (COMBINATIONS 9–12) | | | | | | | | | | | | | | | |
|---|---|---|---|---|---|---|---|---|---|---|---|---|---|---|---|
| D0 | M0 | D1 | M1 | D2 | M2 | D3 | M3 | D4 | M4 | D5 | M5 | D6 | M6 | D7 | M7 |
| 0 | 1 | 0 | 0 | 1 | 1 | 0 | 0 | 0 | 1 | 1 | 0 | 1 | 1 | 1 | 0 |
| ENCODER OUTPUT | | | | | | | | | | | | | | | |
| DXA 0 | DXB 0 | DXC 0 | DXD 0 | DXA 1 | DXB 1 | DXC 1 | DXD 1 | DXA 2 | DXB 2 | DXC 2 | DXD 2 | DXA 3 | DXB 3 | DXC 3 | DXD 3 |
| 1 | 0 | 1 | 0 | 1 | 0 | 1 | 0 | 0 | 1 | 0 | 1 | 0 | 1 | 0 | 1 |

TABLE 4.4

| INCOMING DATA (COMBINATIONS 13–16) | | | | | | | | | | | | | | | |
|---|---|---|---|---|---|---|---|---|---|---|---|---|---|---|---|
| D0 | M0 | D1 | M1 | D2 | M2 | D3 | M3 | D4 | M4 | D5 | M5 | D6 | M6 | D7 | M7 |
| 0 | 0 | 0 | 0 | 1 | 0 | 0 | 0 | 0 | 0 | 1 | 0 | 1 | 0 | 1 | 0 |
| ENCODER OUTPUT | | | | | | | | | | | | | | | |
| DXA 0 | DXB 0 | DXC 0 | DXD 0 | DXA 1 | DXB 1 | DXC 1 | DXD 1 | DXA 2 | DXB 2 | DXC 2 | DXD 2 | DXA 3 | DXB 3 | DXC 3 | DXD 3 |
| 1 | 1 | 1 | 1 | 1 | 1 | 1 | 1 | 1 | 1 | 1 | 1 | 1 | 1 | 1 | 1 |

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A content addressable memory (CAM) block, comprising:
 a CAM array having a plurality of rows and columns of 4-bit NAND-type CAM cells therein, with each of said 4-bit NAND-type CAM cells comprising a ladder-type compare circuit having four two-transistor rungs therein that are electrically connected in parallel.

2. A content addressable memory (CAM) block, comprising:
 a CAM array having a plurality of rows and columns of 4-bit NAND-type CAM cells therein, with at least one of the plurality of rows comprising:
  a first 4-bit NAN D-type CAM cell having a first ladder-type compare circuit with four two-transistor rungs;
  a second 4-bit NAND-type CAM cell having a second ladder-type compare circuit with four two-transistor rungs; and
  a match line segment connected to four source terminals of transistors in the first ladder-type compare circuit and four drain terminals of transistors in the second ladder-type compare circuit.

3. A NAND-type content addressable memory (CAM) cell, comprising:
 a ladder-type compare circuit having at least four multi-transistor rungs connected in parallel between first and second match line terminals; and
 at least four memory cells having respective storage nodes connected to said ladder-type compare circuit.

4. The NAND-type CAM cell of claim 3, wherein said ladder-type compare circuit consists essentially of eight NMOS transistors.

5. A NAND-type content addressable memory (CAM) cell, consisting essentially of:
 a first pair of SRAM memory cells;
 a second pair of SRAM memory cells; and
 a ladder-type compare circuit having a first pair of two-transistor rungs and a second pair of two-transistor rungs that are electrically connected in parallel with the first pair of two-transistor rungs.

6. The NAND-type CAM cell of claim 5, wherein a layout of said first pair of SRAM memory cells is a mirror image of a layout of said second pair of SRAM memory cells; and wherein a layout of the first pair of two-transistor rungs is a mirror-image of a layout of the second pair of two-transistor rungs.

* * * * *